(12) United States Patent
Hui et al.

(10) Patent No.: US 10,948,761 B2
(45) Date of Patent: Mar. 16, 2021

(54) COLOR FILTER SUBSTRATE, FABRICATING METHOD THEREOF, AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Xiang Hui, Beijing (CN); Baojie Zhao, Beijing (CN); Xiaoran Lei, Beijing (CN); Li Wang, Beijing (CN); Yan Zhao, Beijing (CN); Xiongwei Wang, Beijing (CN); Jian Li, Beijing (CN); Chunhong Ma, Beijing (CN); Qinglin Ma, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 159 days.

(21) Appl. No.: 16/229,732

(22) Filed: Dec. 21, 2018

(65) Prior Publication Data
US 2019/0219868 A1    Jul. 18, 2019

(30) Foreign Application Priority Data
Jan. 15, 2018    (CN) .......................... 201810036168.6

(51) Int. Cl.
*G02F 1/1335* (2006.01)
*G03F 7/00* (2006.01)
(Continued)

(52) U.S. Cl.
CPC .. *G02F 1/133516* (2013.01); *G02F 1/136286* (2013.01); *G03F 7/0007* (2013.01); *G03F 9/7084* (2013.01)

(58) Field of Classification Search
CPC ......... G02F 1/133514; G02F 1/133516; G02F 1/136286; G02F 1/1335; G02F 1/1362;
(Continued)

(56) References Cited

U.S. PATENT DOCUMENTS 6,136,481 A * 10/2000 Aoki ...................... G02B 5/201
430/7
2002/0017645 A1    2/2002 Yamazaki et al.
(Continued)

FOREIGN PATENT DOCUMENTS

CN    1677207 A    10/2005
CN    1831608 A    9/2006
(Continued)

OTHER PUBLICATIONS

First Office Action dated Dec. 27, 2019, for corresponding Chinese application 201810036168.6.

*Primary Examiner* — Balram T Parbadia
(74) *Attorney, Agent, or Firm* — Nath, Goldberg & Meyer; Joshua B. Goldberg (57) ABSTRACT

The present disclosure provides a color filter substrate including: a base substrate; and a filter layer on the base substrate and including a plurality of color resist units of a plurality of colors. Orthographic projections of adjacent color resist units of different colors on the base substrate have an overlapping region. Therefore, the color filter substrate has at least one of the following advantages: the structure is simple; the production cost is reduced; the
(Continued)

aperture ratio of the display device including the color filter substrate is improved; and the defect caused by static electricity is solved.

17 Claims, 4 Drawing Sheets

(51) Int. Cl.
    *G02F 1/1362* (2006.01)
    *G03F 9/00* (2006.01)

(58) Field of Classification Search
    CPC ........ G03F 7/0007; G03F 9/7084; G03F 7/00; G03F 9/00
    See application file for complete search history.

(56) References Cited

U.S. PATENT DOCUMENTS

| | | | |
|---|---|---|---|
| 2004/0126676 A1* | 7/2004 | Wang | G03F 7/0007 430/7 |
| 2005/0253984 A1 | 11/2005 | Kim et al. | |
| 2006/0221027 A1 | 10/2006 | Ishihara et al. | |
| 2012/0229740 A1* | 9/2012 | Tsai | G02F 1/133514 349/106 |
| 2012/0308919 A1* | 12/2012 | Chen | G02B 5/201 430/5 |
| 2013/0256669 A1* | 10/2013 | Jang | G02F 1/134363 257/59 |
| 2015/0309377 A1 | 10/2015 | Choi et al. | |
| 2015/0331279 A1* | 11/2015 | Kimura | G02B 5/201 349/42 |
| 2016/0342019 A1 | 11/2016 | Zhao | |
| 2017/0115526 A1* | 4/2017 | Xiong | G03F 1/44 |

FOREIGN PATENT DOCUMENTS

| | | |
|---|---|---|
| CN | 1963637 A | 5/2007 |
| CN | 102645783 A | 8/2012 |
| CN | 202677025 U | 1/2013 |
| CN | 103309081 B | 12/2016 |
| CN | 104503128 B | 1/2018 |

* cited by examiner

COLOR FILTER SUBSTRATE, FABRICATING METHOD THEREOF, AND DISPLAY DEVICE

CROSS-REFERENCE TO RELATED APPLICATION

The present application claims priority to Chinese Patent Application No. 201810036168.6, filed on Jan. 15, 2018, the disclosure of which is hereby incorporated by reference in its entirety.

TECHNICAL FIELD

The present disclosure relates to the field of display technology, more particularly, to a color filter substrate, a fabricating method thereof, and a display device.

BACKGROUND

A liquid crystal display can convert represented image signals into electronic signals, these electronic signals will be converted into tiny pixel points on a liquid crystal molecular layer, and the tiny pixel points then come into a state of allowing backlight light to pass therethrough or a state of blocking light. Each pixel can not only show a change in brightness/darkness but also present a color picture, and thus the liquid crystal display displays an image through a large number of pixel units. The liquid crystal display includes a display panel formed by assembling a color filter substrate with an array substrate, the color filter substrate includes a color resist layer and a black matrix, the color resist layer enables the display panel to display a color picture, and the black matrix can avoid color mixture and light leakage.

However, the conventional color filter substrate and the fabricating method thereof, as well as the display device still leave something to be desired.

SUMMARY

The present disclosure is based on the discovery and recognition of the following facts and problems by the inventors:

At present, a liquid crystal display device always has a problem of poor display effect. The inventors found, after intensive studies and a large number of experiments, that this problem is mainly due to the presence of a black matrix in a color filter substrate constituting the liquid crystal display device. As is understood by those skilled in the art, the current fabricating process of a liquid crystal display includes fabricating an array of thin film transistors on the array substrate side, forming a black matrix and a color resist layer on the color filter substrate side, assembling the array substrate and the color filter substrate to form a cell; and subsequent module assembly process. The black matrix can block light reflected from a metal layer and separate adjacent color resist layers, so as to prevent color mixture or light leakage. However, due to the presence of the black matrix, it is difficult to increase the aperture ratio of the liquid crystal display device, thereby affecting the display effect of the liquid crystal display device. Further, the inventors have found that the material for foaming the black matrix contains carbon whose electrical resistivity is low, which greatly increases the risk of introducing static electricity thereby further affecting the display effect of the liquid crystal display device. In order to lower the risk of static electricity, an anti-static structure needs to be provided. Therefore, it is necessary to additionally use a mask, thereby reducing the commonality of the masks for the color resist layer, adding a fabricating procedure, and increasing the production cost.

The present disclosure is intended to alleviate or obviate at least one of the problems due to limitations and disadvantages of the related art.

In an aspect, embodiments of the present disclosure provide a color filter substrate. The color filter substrate includes: a base substrate; and a filter layer on the base substrate and including a plurality of color resist units of a plurality of colors, wherein orthographic projections of adjacent color resist units of different colors on the base substrate have an overlapping region.

According to an embodiment of the present disclosure, for two adjacent color resist units of different colors, at least a part of a sidewall, close to the adjacent color resist unit, of each color resist unit is an inclined surface, and orthographic projections of the respective inclined surfaces on the base substrate completely coincide.

According to an embodiment of the present disclosure, the plurality of color resist units of the plurality of colors include a first color resist unit having a first color and a plurality of second color resist units having a plurality of colors, light transmittance of the first color resist unit is lower than light transmittances of the second color resist units, and an alignment mark is provided between two adjacent second color resist units having different colors.

According to an embodiment of the present disclosure, an orthographic projection of the alignment mark on the base substrate covers the overlapping region of the orthographic projections of the two adjacent second color resist units having different colors on the base substrate.

According to an embodiment of the present disclosure, the alignment mark and the first color resist unit are in a same layer and made of a same material, and a height of the alignment mark is smaller than a height of the first color resist unit.

According to an embodiment of the present disclosure, a width K of the alignment mark satisfies: $K=L+2$ μm, where L is a width of the overlapping region.

According to an embodiment of the present disclosure, the plurality of color resist units include first color resist units and second color resist units arranged in a plurality of rows, and the second color resist units include color resist units of two colors.

According to an embodiment of the present disclosure, in a direction perpendicular to a direction in which the plurality of color resist units are arranged, a cross section of the first color resist unit is a non-inverted trapezoid, and a cross section of the second color resist unit having a first color is an inverted trapezoid, and a cross section of the second color resist unit having a second color is a parallelogram.

According to an embodiment of the present disclosure, the first color resist unit is a blue color resist unit, and the second color resist units include a red color resist unit and a green color resist unit.

In another aspect, embodiments of the present disclosure further provide a display device including any one of the above color filter substrates.

According to an embodiment of the present disclosure, the display device further includes: an array substrate assembled with the color filter substrate, the array substrate is provided with a plurality of gate lines and a plurality of data lines, the plurality of color resist units of the plurality of colors include a first color resist unit having a first color and a plurality of second color resist units having a plurality of colors, light transmittance of the first color resist unit is lower than light transmittances of the second color resist units, and in the presence of an alignment mark provided between two adjacent second color resist units having different colors, an orthographic projection on the array substrate of at least one of the gate line and the data line is within an orthographic projection on the array substrate of the alignment mark on the color filter substrate.

According to an embodiment of the present disclosure, the display device is a virtual reality display device.

In another aspect, embodiments of the present disclosure further provide a method for fabricating a color filter substrate, wherein the color filter substrate is any one of the above color filter substrates, and the method includes:

sequentially forming a plurality of color resist units of a plurality of colors on a base substrate, wherein a boundary of the color resist unit previously formed determines a starting boundary of the color resist unit that is to be formed next and adjacent to the color resist unit previously formed.

According to an embodiment of the present disclosure, the plurality of color resist units include a first color resist unit having a first color and a plurality of second color resist units having a plurality of colors, light transmittance of the first color resist unit is lower than light transmittances of the second color resist units, and sequentially forming the plurality of color resist units of the plurality of colors on the base substrate includes:

forming, on the base substrate, the first color resist unit by a first patterning process; and sequentially forming the second color resist units having the plurality of colors by patterning processes based on an edge of the first color resist unit, wherein color resist units having a same color among the second color resist units are simultaneously formed through a same patterning process.

According to an embodiment of the present disclosure, the plurality of color resist units include first color resist units and second color resist units arranged in a plurality of rows, and the second color resist units includes color resist units of two colors;

forming, on the base substrate, the first color resist unit by the first patterning process includes:

forming, on the base substrate, the first color resist units arranged in parallel by the first patterning process, sequentially forming the second color resist units having the plurality of colors by patterning processes based on the edge of the first color resist unit includes:

forming, based on edges of the first color resist units, a plurality of second color resist units having a first color and arranged in parallel by a second patterning process; and forming, based on edges of the second color resist units having the first color away from the first color resist units, a plurality of second color resist units having a second color and arranged in parallel by a third patterning process.

According to an embodiment of the present disclosure, the method further includes: forming an alignment mark, wherein the alignment mark is disposed between adjacent second color resist units of different colors that are subsequently formed, and in a step of sequentially forming the second color resist units, an edge, away from the first color resist unit, of a second color resist unit having a first color which is first formed is determined by the alignment mark.

According to an embodiment of the present disclosure, an orthographic projection of the alignment mark on the base substrate covers an overlapping region of the orthographic projections of two adjacent second color resist units having different colors on the base substrate.

According to an embodiment of the present disclosure, the alignment mark and the first color resist unit are synchronously formed by the first patterning process.

According to an embodiment of the present disclosure, a width K of the alignment mark satisfies: K*L+2 µm, where L is a width of an overlapping region of adjacent second color resist units having different colors and on opposite sides of the alignment mark.

According to an embodiment of the present disclosure, an exposure precision of an exposure process in the first patterning process for forming the first color resist unit is higher than an exposure precision of an exposure process in the patterning processes for forming the second color resist units.

BRIEF DESCRIPTION OF THE DRAWINGS

The above and/or additional aspects and advantages of the present disclosure will become apparent and readily understood from the description of embodiments in conjunction with the following accompanying drawings.

DETAILED DESCRIPTION

Embodiments of the present disclosure will be described in detail below, and examples of the embodiments are illustrated in the drawings. In the specification, same or similar reference numerals are used to refer to same or similar elements or elements having same or similar functions. The embodiments described below with reference to the accompanying drawings are intended to be illustrative only, and should not to be construed as limiting the present disclosure.

Figure 1:
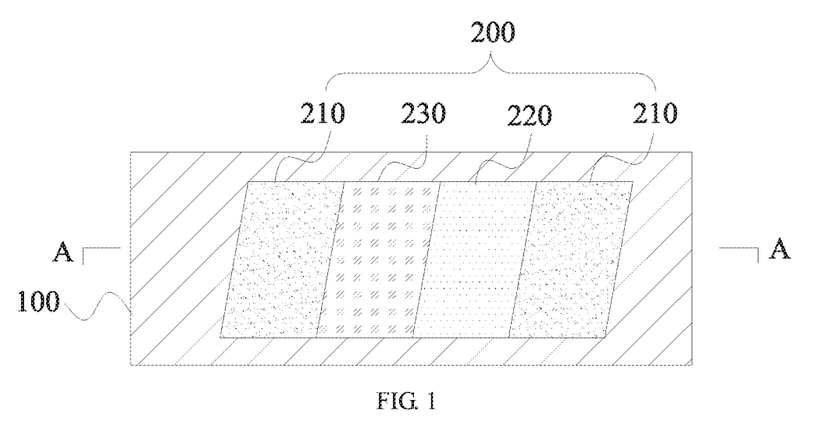
FIG. 1 is a schematic structural diagram of a color filter substrate according to an embodiment of the present disclosure.
Figure 2:
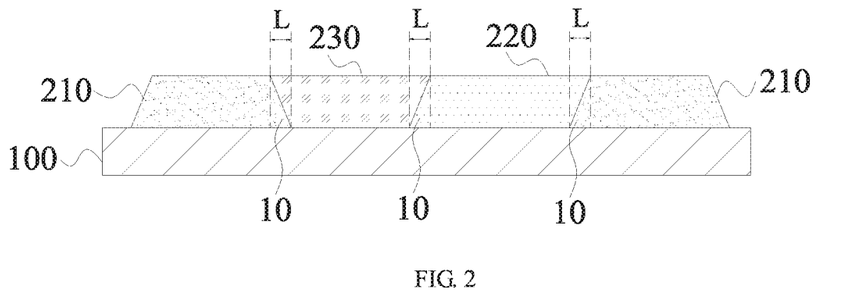
FIG. 2 is a cross sectional view taken along a line A-A in FIG. 1.

In an aspect of the disclosure, a color filter substrate is provided. According to an embodiment of the present disclosure, referring to FIG. 1 and FIG. 2, the color filter substrate includes: a base substrate 100 and a filter layer 200, the filter layer 200 is on the base substrate 100 and includes a plurality of color resist units of a plurality of colors. Orthographic projections of adjacent color resist units of different colors on the base substrate 100 have an overlapping region, as shown in FIG. 2. Since a black matrix is omitted, the color filter substrate has at least one of the following advantages: the structure is simple; the production cost is reduced; the aperture ratio of the display device including the color filter substrate is improved; and the defect caused by static electricity is alleviated.

For ease of understanding, the principle of the color filter substrate according to an embodiment of the present disclosure is first briefly described as below.

As described above, a current color filter substrate includes a filter layer and a black matrix, and the black matrix can block light reflected from a metal layer and separate adjacent color resist layers, so as to prevent color mixture or light leakage. However, due to the presence of the black matrix, it is difficult to increase the aperture ratio of the display device, thereby affecting the display effect of the display device. Further, the material for forming the black matrix contains carbon whose electrical resistivity is low, which greatly increases the risk of introducing static electricity, thereby further affecting the display effect of the display device. In order to alleviate the defect caused by static electricity, an anti-static structure needs to be provided. However, it is necessary to use a new mask to form the anti-static structure, and thus an additional fabricating procedure is required, thereby complicating the fabricating process and reducing the commonality of the masks for the color resist layer.

The embodiments of the present disclosure provide a color filter substrate without a black matrix, edge areas of adjacent color resist units of different colors on the color filter substrate overlap with one another (i.e., orthographic projections on the base substrate 100 of edge areas of adjacent color resist units of different colors on the color filter substrate overlap with one another) to form an overlapping region, and due to relatively low light transmittance of the overlapping region, effects of preventing light leakage and light mixture can be achieved. According to an embodiment of the present disclosure, the color filter substrate has no black matrix, and thus, the color filter substrate has a simple structure and low production cost. Further, the aperture ratio of a display device including the color filter substrate can be remarkably improved, and problems such as electrostatic failure caused by the black matrix can be avoided.

Hereinafter, structures of the color filter substrate will be described in detail according to specific embodiments of the present disclosure.

According to an embodiment of the present disclosure, at least a portion of a sidewall of a color resist unit close to its adjacent color resist unit of a different color is an inclined surface, and thus the sidewalls of the two adjacent color resist units of different colors are in contact with each other through the inclined surfaces. According to an embodiment of the present disclosure, when forming the filter layer, a color resist unit may be first formed on the base substrate 100, and then a boundary (e.g., an edge) of the formed color resist unit may serve as a starting position for subsequently forming a color resist unit. For example, when first forming a color resist unit of a single color, the color resist unit may be formed to have an obviously inclined surface by controlling an amount of exposure. Then, a color resist unit of another single color is formed at a position adjacent to the color resist unit of the single color by a patterning process. Thereby, the sidewall of the formed color resist unit of the another single color is in contact with the sidewall of the color resist unit of the single color through the respective inclined surfaces (i.e., the inclined surfaces of the sidewalls of the color resist unit of the single color and the color resist unit of the another single color are in contact with one another), and the overlapping region 10 may be formed in the region where the color resist unit of the another single color and the color resist unit of the single color are in contact. Thereby, the light transmittance of the overlapping region 10 is remarkably lowered, so that the color filter substrate can achieve an effect of preventing light leakage and color mixture.

According to an embodiment of the present disclosure, the plurality of color resist units include a first color resist unit having a first color and a plurality of second color resist units having a plurality of colors, and a light transmittance of the first color resist unit is lower than light transmittances of the second color resist units. Therefore, the first color resist unit having a low light transmittance is first formed and serves as a mark for subsequently forming the second color resist units. The specific color of each color resist unit is not particularly limited, and those skilled in the art may design according to specific conditions, as long as the light transmittance of the first color resist unit having the first color is lower than the light transmittances of the second color resist units. According to an embodiment of the present disclosure, the second color resist units may include color resist units having two or more colors. For example, the second color resist units may include color resist units having three colors, and the color filter substrate may adopt an KGBW (red, green, blue, white) color scheme. Alternatively, the second color resist units may have two colors, and the color filter substrate may adopt an RGB (red, green, blue) color scheme. In the followings, for ease of description, description is given by taking an RGB stripe as an example. In this case, the color resist units include a blue color resist unit 210, a green color resist unit 220, and a red color resist unit 230. According to an embodiment of the disclosure, the first color resist unit may be a blue color resist unit 210, and the second color resist units may include a green color resist unit 220 and a red color resist unit 230. In the RGB color scheme, the blue color resist unit has the lowest light transmittance (light transmittance is about 10%), and by using the blue color resist unit 210 as the first color resist unit, the light transmittance of the overlapping region can be reduced to the largest extent. That is to say, the first color resist unit that is formed first has the color having the lowest light transmittance among all colors in the color scheme (e.g., RGB color scheme, RGBW color scheme, etc.).

According to an embodiment of the present disclosure, referring to FIG. 2, the blue color resist unit 210, the green color resist unit 220, and the red color resist unit 230 may each have two inclined surfaces, and the adjacent inclined surfaces of two adjacent color resist units have an overlapping region 10. The light transmittance of the blue color resist unit 210 is lower than the light transmittances of both the green color resist unit 220 and the red color resist unit 230, in an area where the blue color resist unit 210 and the green color resist unit 220 contact, an area where the green color resist unit 220 and the red color resist unit 230 contact, and an area where the red color resist unit 230 and the blue color resist unit 210 contact, the light transmittance of the overlapping region 10 is significantly reduced due to the presence of the overlapping region, thereby achieving the effects of preventing light leakage and color mixture. It can be understood by those skilled in the art that the blue color resist unit 210, the green color resist unit 220, and the red color resist unit 230 are all formed by a patterning process including, but not limited to, exposure, development, and the like. That is, a color photoresist layer having a corresponding color is first formed on the base substrate 100, and then a plurality of color resist units arranged in parallel are formed simultaneously by processes such as exposure and development. Since both sidewalls of the blue color resist unit 210 are inclined surfaces, the sidewall of the green color resist unit 220 formed immediately adjacent to the blue color resist unit 210 is also an inclined surface. Since the degrees of exposure and development on the green color photoresist layer change with the thickness of the color photoresist layer when forming the green color resist unit 220 by the exposure and development processes, the other sidewall of the formed green color resist unit 220 is also an inclined surface. The red color resist unit 230 is formed between the green color resist unit 220 and another blue color resist unit 210, and thus both sidewalls of the red color resist unit 230 are also inclined surfaces. In this manner, the overlapping regions can be easily formed between the plurality of color resist units, thereby avoiding color mixture between the color resist units of different colors.

In the process of forming the color resist units, a plurality of blue color resist units may be formed first. Since the color photoresist has a certain thickness, a part of the color photoresist close to the base substrate and a part of the color photoresist away from the base substrate actually undergo different amounts of exposure, so that the sidewalls of the finally formed color resist unit are not vertical structures. Further, after exposure and development, the color photoresist needs to undergo a heat curing process, and in this process, the color photoresist having a certain thickness will form into a structure having a narrow top and a wide bottom under the action of gravity. Therefore, a first color resist unit (e.g., a blue color resist unit) whose longitudinal section has a non-inverted trapezoidal shape can be obtained using conventional exposure and development processes. The second color resist unit is formed based on the first color resist unit, and therefore, one sidewall of the second color resist unit contacting the first color resist unit is inclined in the same direction as the sidewall of the first color resist unit, and the other sidewall thereof is also formed as a structure with a narrow top and a wide bottom by the exposure and development processes, so that the longitudinal section of the second color resist unit (e.g., the green color resist unit) may be parallelogram-like. The third color resist unit is formed between the second color resist unit and the first color resist unit, and its two boundaries (edges) are defined by the sidewalls of the first color resist unit and the second color resist unit. That is, the sidewall, in contact with the second color resist unit, of the third color resist unit is inclined in the same direction as the sidewall of the second color resist unit, the sidewall of the third color resist unit on the other side is in contact with the sidewall of the next first color resist unit and inclined in the same direction as the sidewall of the next first color resist unit, and thus the third color resist unit (e.g., a red color resist unit) having an inverted trapezoidal shape is finally formed. As such, overlapping regions can be formed between the first color resist unit, the second color resist unit, and the third color resist unit, respectively.

According to an embodiment of the present disclosure, the width L of the overlapping region formed by adjacent color resist units may range from 1.5 µm to 3 µm. In the embodiment shown in FIG. 2, the overlapping region 10 formed by the blue color resist unit 210 and the green color resist unit 220 may have a width ranging from 2 µm to 3 µm, and the overlapping region 10 formed by the green color resist unit 220 and the red color resist unit 230 and the overlapping region 10 formed by the red color resist unit 230 and the blue color resist unit 210 may both have a width ranging from 1.5 µm to 3 µm. Alternatively, in the case where the positions of the green color resist unit 220 and the red color resist unit 230 are exchanged (this case is not shown), the overlapping region 10 formed by the blue color resist unit 210 and the red color resist unit 220 may have a width ranging from 2 µm to 3 µm, and the overlapping region 10 formed by the green color resist unit 220 and the red color resist unit 230 and the overlapping region 10 formed by the green color resist unit 230 and the blue color resist unit 210 may both have a width ranging from 1.5 µm to 3 µm. In this manner, each color resist unit can achieve its function, and at the same time, the overlapping region can have a low light transmittance. With the overlapping region 10 having a width in the above range, it is possible to effectively prevent color mixture between color resist units of different colors without significantly increasing precision requirement in the exposure process due to too small width of the overlapping region 10, thereby facilitating saving production costs.

According to an embodiment of the present disclosure, after the position of the blue color resist unit 210 is determined, the edge of the blue color resist unit 210 may be used as a starting boundary for the green color resist unit 220, and then an edge, away from the blue color resist unit 210, of the green color resist unit 220 may be used as a starting boundary for the red color resist unit 230. As such, the positioning of the color resist units can be achieved.

According to the embodiment of the present disclosure, in order to further enhance the effects of preventing light leakage and color mixture of the color filter substrate, and better position each color resist unit in the fabricating process, an alignment mark may be provided between two adjacent second color resist units. The alignment mark may be formed of a material forming the first color resist unit, and may be formed simultaneously with the first color resist unit. As such, the second color resist units of different colors can be accurately positioned by the alignment mark, so that overlapping regions having certain widths are formed between the second color resist unit and the first color resist unit and between two second color resist units, thereby further reducing the light transmittance in the overlapping region, and improving the effects of preventing light leakage and color mixture. As described above, the first color resist unit may have the color having the lowest light transmittance among all colors in the color scheme, and thus the light transmittance at the alignment mark is also low, which can make an area between two second color resist units also have a low light transmittance. Therefore, it is advantageous to prevent color mixture between two second color resist units. It should be particularly noted that the second color resist units may include a plurality of color resist units of different colors, as long as the transmittances of the color photoresists forming the second color resist units are lower than the transmittance of the color photoresist forming the first color resist unit.

According to an embodiment of the present disclosure, in an RGB color scheme, the color filter substrate has an alignment mark made of a material for forming the blue color resist unit 210, and the alignment mark is disposed between the green color resist unit 220 and the red color resist unit 230 that are adjacent to each other. The length of the alignment mark is not particularly limited, and may be designed by those skilled in the art according to specific conditions, as long as the alignment mark can accurately position the color resist units. For example, according to an embodiment of the present disclosure and referring to FIG. 3, the alignment mark 20 is disposed correspondingly to the overlapping region, and may not extend into the overlapping region of the green color resist unit 220 and the red color resist unit 230. For example, the alignment mark 20 may be located in an extending area of the overlapping region of the green color resist unit 220 and the red color resist unit 230, but outside the overlapping region of the green color resist unit 220 and the red color resist unit 230. According to an embodiment of the present disclosure, in the process of fabricating the green color resist unit 220 and the red color resist unit 230, the left edge of the green color resist unit 220 may take the left edge of the alignment mark 20 as its maximum boundary limit, and the right edge of the red color resist unit 230 may take the right edge of the alignment mark 20 as its maximum boundary limit. As such, the color resist units can be accurately positioned.

According to an embodiment of the present disclosure, an orthographic projection of the alignment mark on the base substrate 100 may overlap with the overlapping region 10 between orthographic projections, on the base substrate 100, of two adjacent second color resist units. Optionally, the orthographic projection of the alignment mark on the base substrate 100 may cover the overlapping region 10 between the orthographic projections, on the base substrate 100, of two adjacent second color resist units. Optionally, for example, referring to FIG. 4, the alignment mark 20 may extend into the overlapping region formed by the green color resist unit 220 and the red color resist unit 230, and completely cover the overlapping region. In this manner, the color resist units can be accurately positioned by the alignment mark. In addition, according to an embodiment of the present disclosure, the material of the alignment mark 20 is the same as the material of the blue color resist unit 210, and therefore, the alignment mark 20 has a low transmittance. By having the alignment mark 20 in the overlapping region of the green color resist unit 220 and the red color resist unit 230, the light transmittance of the overlapping region can be further lowered, and the effect of preventing light leakage and cross color can be enhanced.

Figure 3:
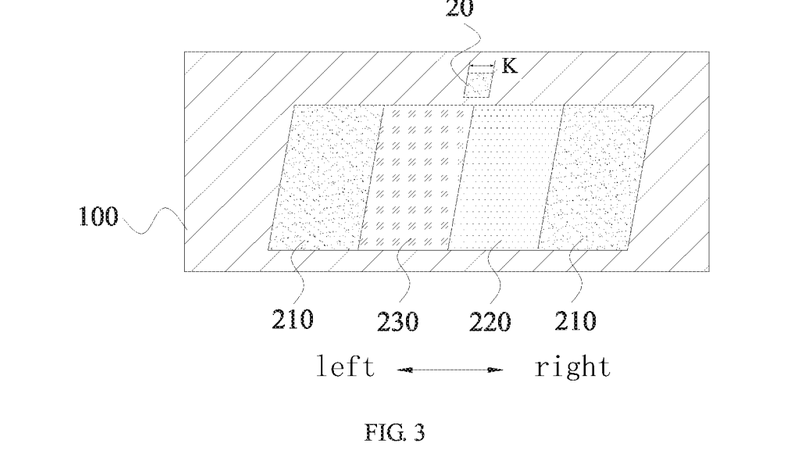
FIG. 3 is a schematic structural diagram of a color filter substrate according to an embodiment of the present disclosure.
Figure 4:
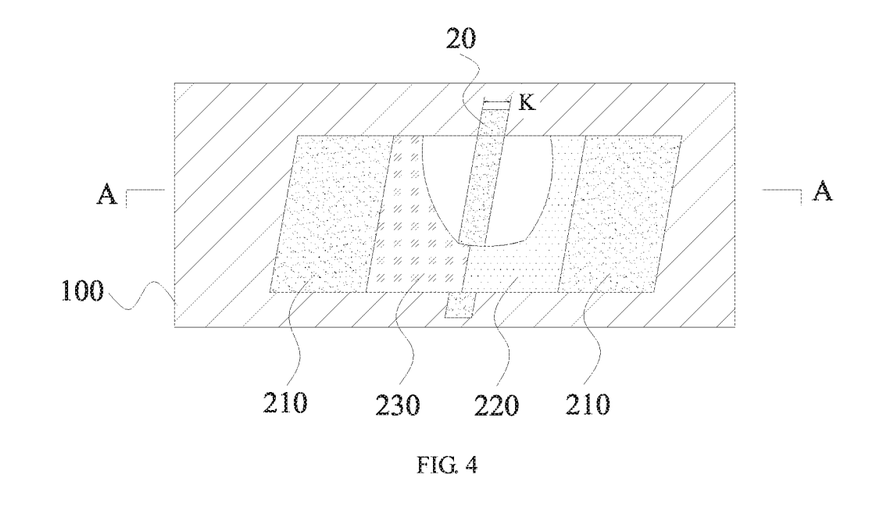
FIG. 4 is a schematic structural diagram of a color filter substrate according to another embodiment of the present disclosure.

According to an embodiment of the present disclosure, the width K of the alignment mark 20 (as shown in FIGS. 3 and 4) is slightly larger than the width L of the overlapping region 10 between two second color resist units. For example, K=(L+2) μm. That is to say, the width of the alignment mark 20 is obtained by adding 1 μm at each side of the overlapping region 10. In this case, it can be ensured that the overlapping region between the green color resist unit 220 and the red color resist unit 230, i.e., the overlapping region of the orthographic projections of the green color resist unit 220 and the red color resist unit 230 on the base substrate 100, is within the projection of the alignment mark 20 on the base substrate 100, without strictly controlling the boundary of the second color resist unit (i.e., green color resist unit 220). Therefore, on the one hand, the light transmittance of the overlapping region can be reduced, light leakage in the overlapping region between the green color resist unit 220 and the red color resist unit 230 can be prevented, and on the other hand, the requirement for alignment precision in the fabricating process can be reduced.

Figure 5:
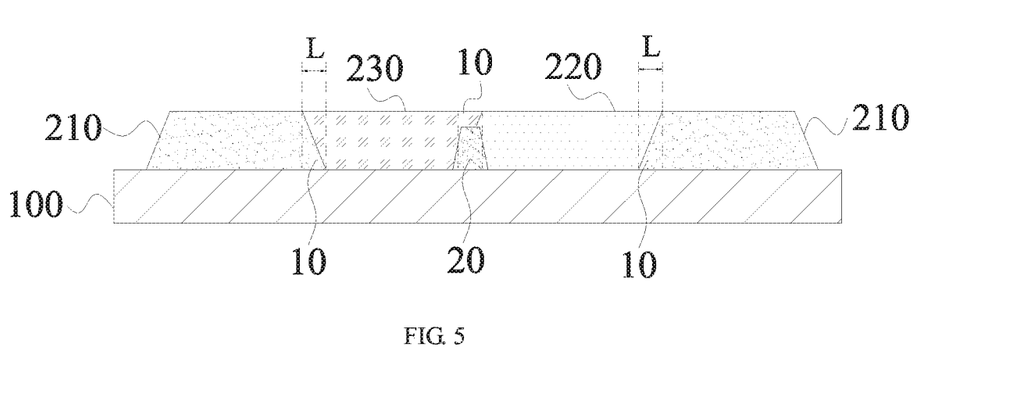
FIG. 5 is a cross sectional view taken along a line A-A in FIG. 4.
Figure 6:
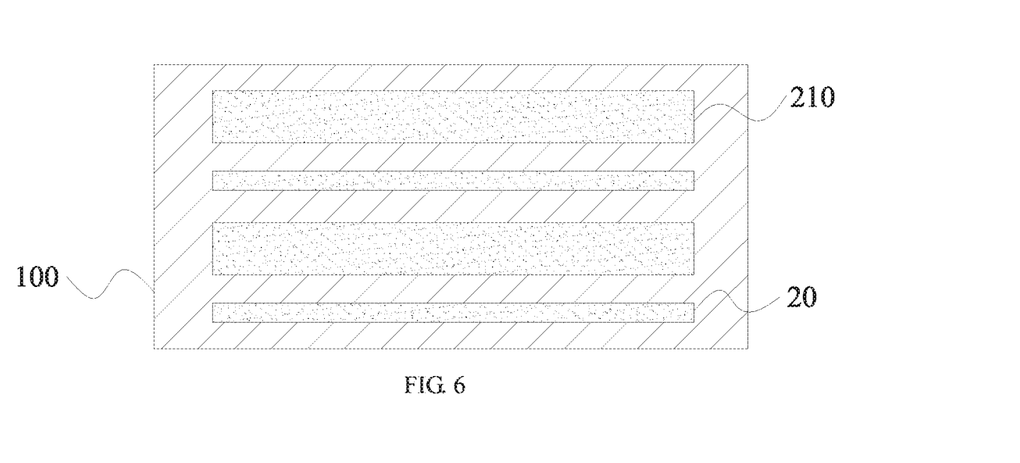
FIG. 6 is a schematic diagram illustrating positions of a first color resist unit and an alignment mark according to an embodiment of the present disclosure.

According to an embodiment of the present disclosure, the alignment mark is disposed in the same layer as the first color resist unit, and has a height smaller than the height of the first color resist unit. Thus, the alignment mark and the first color resist unit can be formed simultaneously, and since the height of the alignment mark is smaller than the height of the first color resist unit, the overall flatness of the filter layer will not be affected. According to an embodiment of the present disclosure, referring to FIGS. 5 and 6, in an RUB color scheme, the alignment mark 20 is disposed in the same layer as the blue color resist unit 210, and the height of the alignment mark 20 is smaller than the height of the blue color resist unit 210. Therefore, the overall flatness of the filter layer is not affected. According to an embodiment of the present disclosure, the alignment mark 20 and the blue color resist unit 210 are disposed in a same layer and may be formed by a same patterning process. Since the width of the alignment mark 20 is much smaller than the width of the blue color resist unit 210, the height of the alignment mark 20 that is finally formed through the processes such as exposure and development is naturally lower than the height of the blue color resist unit 210, and there is no need to additionally monitor the heights of the alignment mark 20 and the blue color resist unit 210.

According to an embodiment of the present disclosure, the color filter substrate may further include a planarization layer and a spacer. According to an embodiment of the present disclosure, the planarization layer is disposed on a side of the filter layer away from the base substrate. Since the color filter substrate has no black matrix, better planarization effect can be achieved, and the thickness of the planarization layer can be appropriately decreased, which further reduces the production costs. Those skilled in the art will appreciate that over coating (OC) can be utilized to form the planarization layer. According to an embodiment of the present disclosure, the spacer is disposed on a side of the planarization layer away from the filter layer to provide a space for accommodating liquid crystal molecules. It should be noted that the planarization layer according to the embodiment of the present disclosure has a better planarization effect, and the spacers may have a relatively flat base, so that the uniformity of the spacers can be improved.

In another aspect of the disclosure, the present disclosure provides a display device. According to an embodiment of the present disclosure, the display device includes the color filter substrate described above, and thus the display device has all of the features and advantages of the color filter substrate described above, and details thereof are not described repeatedly herein. In general, the display device has a good display effect and a low production cost.

According to an embodiment of the present disclosure, the display device may further include: an array substrate assembled with the color filter substrate, and a plurality of gate lines and a plurality of data lines are provided on the array substrate. Orthographic projections, on the array substrate, of the gate lines or the data lines are within orthographic projections, on the array substrate, of the alignment marks on the color filter substrate. Therefore, the alignment marks may be provided at positions corresponding to the gate lines or the data lines. For example, according to an embodiment of the present disclosure, the alignment mark that is not extended into the overlapping region formed by the green color resist unit and the red color resist unit may be disposed at a position corresponding to the gate line or the data line. Those skilled in the art can understand that, a plurality of gate lines and a plurality of data lines perpendicular to one another are generally disposed on the array substrate, and the gate lines and the data lines intersecting with one another define sub-pixel structures. According to an embodiment of the present disclosure, a gate line or a data line may be disposed correspondingly to the alignment mark, and a line perpendicular thereto (i.e., also perpendicular to the alignment mark) may be arranged by those skilled in the art in a familiar wiring way. That is to say, it is possible to occlude, by the alignment mark having a low transmittance, the line (data line or gate line) parallel to the alignment mark. According to an embodiment of the present disclosure, the alignment mark extending into the overlapping region formed by the green color resist unit and the red color resist unit may be disposed at a position corresponding to the data line.

According to an embodiment of the present disclosure, the display device may be a virtual reality display device. Therefore, the virtual reality display device has a high aperture ratio, and fine and smooth screen display. Those skilled in the art can understand that the virtual reality display device utilizes the principle of stereoscopic vision so that one eye can only see odd-numbered frame images, and the other eye can only see even-numbered frame images, and parallax between odd-numbered and even-numbered frames creates stereo perception. However, the current virtual reality display device has a problem of "window screen effect", that is, since the magnifying lens is disposed in the virtual reality display device, the risk that the black matrix is seen by naked eyes is high, and a user feels like seeing a thing through a window screen when using the virtual reality display device, affecting the visual effect. Therefore, the presence of the black matrix seriously affects the development of virtual reality display devices.

According to the embodiments of the present disclosure, the color filter substrate has no black matrix, and therefore, the virtual reality display device provided with the color filter substrate can have a high aperture ratio, and the "window screen effect" can be alleviated or eliminated. Moreover, since the virtual reality display device creates a closed environment, for example, virtual reality glasses, into which no reflected light is emitted, achieves purely transmissive display, and therefore, there is no need to consider the problem that the black matrix blocks reflected light from the metal layer. In addition, when the user uses the virtual reality glasses, the position of the glasses is fixed, and therefore, the incident light is almost vertical, which greatly reduces the risk of visual color mixture. Therefore, the virtual reality display device using the color filter substrate described above can have a good display effect, and alleviate the problem of light leakage and color mixture due to the absence of the black matrix.

In another aspect of the present disclosure, the present disclosure provides a method for fabricating a color filter substrate. According to an embodiment of the present disclosure, the color filter substrate fabricated by the method may be the color filter substrate described above, and thus the color filter substrate fabricated by the method may have the same features and advantages as the color filter substrate described above, which will not be repeated here. For example, according to an embodiment of the present disclosure, a color filter substrate fabricated by the method includes a base substrate and a filter layer disposed on the base substrate, the filter layer including a plurality of color resist units of a plurality of colors, and orthographic projections, on the base substrate, of adjacent color resist units of different colors have an overlapping region.

According to an embodiment of the present disclosure, the method includes: sequentially forming color resist units of different colors on a base substrate, wherein color resist units of a same color are formed simultaneously, and starting boundaries of color resist units formed subsequently are determined depending on the boundaries of the color resist units adjacent thereto and formed previously. Therefore, the method has at least one of the following advantages: simple process, shortened production time, reduced research and development cost and production cost; in addition, the obtained color filter substrate can improve the aperture ratio of the display device including the same, and the problem of electrostatic failure can be solved.

It can be understood by those skilled in the art that the fabrication of the color filter substrate currently includes: forming a black matrix on the base substrate, sequentially forming a plurality of color resist units of a plurality of colors on a side of the black matrix away from the base substrate, then forming a planarization layer on a side of the color resist units away from the black matrix, and forming a spacer on a side of the planarization layer away from the color resist units. For an RGB color scheme, in the processes of forming a black matrix, a red color resist unit, a green color resist unit, a blue color resist unit, and a spacer, a separate production line is required to form each structure, and each production line needs to be separately equipped with expensive production equipment such as coating machine, exposure machine, and developing machine, and corresponding photoresist and mask need to be purchased separately for each photolithography process. Therefore, in the current RGB color scheme, five photolithography processes are required, five production lines, five masks and six photoresists need to be purchased, and the process flow is complicated and the production time is long.

According to the embodiments of the present disclosure, by using the method to fabricate the color filter substrate, fabrication of the black matrix can be omitted, and the color filter substrate can have better effects of preventing light leakage and color mixture. Omitting the fabrication of the black matrix can reduce one production line, reduce one mask, and reduce one photoresist, thereby simplifying the process and shortening the production time. In addition, the black matrix is omitted in the color filter substrate, and fabrication of the antistatic structure can be omitted, thereby improving the commonality of the masks for color resist units, further simplifying the production process and reducing the production cost.

According to an embodiment of the present disclosure, the plurality of color resist units include a first color resist unit having a first color and second color resist units having a plurality of colors. For example, the second color resist units may have two colors, and the light transmittance of the first color resist unit is lower than the light transmittances of the second color resist units. Since the first color resist unit is first formed on the base substrate, and the edge thereof is used as a boundary mark for forming the second color resist unit, adopting the color having a low light transmittance as the color of the first color resist unit facilitates preventing color mixture between color resist units of different colors. The specific colors of the first color resist unit and the second color resist units have been described in detail above and will not be described herein. For example, according to an embodiment of the present disclosure, the first color resist unit may be a blue color resist unit, and the second color resist unit may include a green color resist unit and a red color resist unit.

According to an embodiment of the present disclosure, the first color resist unit and the second color resist units are formed by: first forming a plurality of first color resist units by a first patterning process on the base substrate, and then sequentially forming a plurality of second color resist units of a plurality of colors, wherein color resist units having a same color in the second color resists are simultaneously formed. In the case that the second color resist units includes two colors, sequentially forming the second color resist units includes: forming a plurality of second color resist units having a single color by a patterning process (i.e., a second patterning process) based on edges of the first color resist units, and then forming a plurality of second color resist units having another single color by a patterning process (a third patterning process) based on the edges of the formed second color resist units away from the respective first color resist units. In the case that the second color resist units include three colors, sequentially forming the second color resist units further includes: forming a plurality of second color resist units having yet another single color by a patterning process (a fourth patterning process) based on the edges of the formed second color resist units and/or the edges of the first color resist units. In this manner, a starting boundary for a color resist unit to be formed subsequently can be determined by the edge of the color resist unit formed previously, achieving positioning of the color resist units.

The patterning process is not particularly limited, and may be selected by those skilled in the art according to the specific circumstances. For example, according to an embodiment of the present disclosure, the first patterning process, the second patterning process, and the third patterning process may be implemented by a photolithography process.

According to an embodiment of the present disclosure, in order to achieve accurate positioning of the respective color resist units, an alignment mark may be disposed between two second color resist units, the alignment mark and the first color resist unit are made of a same material and formed in a same patterning process. As such, the production process can be simplified and the production time can be shortened. According to the embodiment of the present disclosure, by providing the alignment mark, two edges, that are in contact, of the two second color resist units can be determined according to the alignment mark. The determination of the edge of the second color resist unit has been described in detail above and will not be described herein. As described above, the first color resist unit may have the color having the lowest light transmittance among colors in the color scheme, and accordingly the light transmittance at the alignment mark is low, thereby making an area between the two second color resist units have a lower transmittance. This facilitates preventing color mixture between the two second color resist units. It should be particularly noted that the second color resist units may include a plurality of color resist units of different colors, as long as the transmittances of the color photoresists for forming the second color resist units are lower than the transmittance of the color photoresist for forming the first color resist unit.

The specific position and length of the alignment mark have also been described in detail above, and will not be described herein. For example, according to an embodiment of the present disclosure, the alignment mark may be disposed at a position corresponding to the gate line or the data line, and the alignment mark may not extend into the two second color resist units, or the alignment mark may extend into the overlapping region of adjacent second color resist units. The structure in which the alignment mark does not extend into the two second color resist units is shown in FIG. 3. The structure in which the alignment mark extends into the two second color resist units is shown in FIG. 4. The alignment mark may partly overlap with the overlapping region of the two second color resist units, or completely cover the overlapping region of the two second color resist units.

The steps of the method are described in detail below according to an embodiment of the present disclosure.

According to an embodiment of the present disclosure, the first color resist unit and the alignment mark are formed by a first patterning process. According to an embodiment of the present disclosure, a blue color resist layer for forming a blue color resist unit is first formed, then the blue color resist layer is exposed and developed using a photolithographic mask to form a blue color resist unit and an alignment mark. It will be understood by those skilled in the art that in the method, the color resist unit formed first functions as an alignment mark in the subsequent step, and thus the exposure precision is required to be high. According to an embodiment of the present disclosure, an exposure machine having an alignment precision of 1 µm or below may be used to form the blue color resist unit and the alignment mark, so that the blue color resist unit and the alignment mark can be accurately positioned. In addition, the photolithographic mask used in the first pattering process may be prepared in advance and include patterns of the blue color resist layer and the alignment mark, for example, the photolithographic mask may include a pattern of the blue color resist layer formed by a plurality of strips arranged in parallel and a pattern of the alignment mark between two adjacent strip blue color resist layers. Alternatively, the fabrication of the photolithographic mask may be included in the first patterning process. For example, a photoresist may be applied on a side of the blue color resist layer for forming the blue color resist unit away from the base substrate, and then be exposed and to form the photolithographic mask, and the photolithographic mask includes a pattern of the blue color resist layer formed by a plurality of strips arranged in parallel and a pattern of the alignment mark between two adjacent strip blue color resist layers. Subsequently, the blue color resist layer is exposed and developed using the photolithographic mask to form the blue color resist unit and the alignment mark.

The inventors found that the photoresist may be replaced during the fabricating process, and the exposure deviation of a same photoresist produced by different manufacturers is different. An empirical value of the exposure deviation of the current exposure machine with respect to the blue photoresist is 0 µm to 3 µm, and thus a specific width of the pattern of the alignment mark according to the embodiment of the present disclosure can be determined based on the exposure deviation. According to an embodiment of the present disclosure, the width of the pattern of the alignment mark is a difference between the preset width K of the alignment mark and the exposure deviation of the material of the blue color resist layer, and thus the specific width of the pattern of the alignment mark can be specifically determined according to blue photoresists from different manufacturers.

According to an embodiment of the present disclosure, after forming the blue color resist unit and the alignment mark, a green color resist unit is formed by a second patterning process. In an embodiment, a green color resist layer is deposited on the base substrate, and then is exposed and developed by using a photolithographic mask to form the green color resist unit. The photolithographic mask for forming the green color resist unit may be formed using a method similar to the method for forming the photolithographic mask for forming the blue color resist unit as described above, which is not repeatedly described herein.

According to an embodiment of the present disclosure, after forming the green color resist unit, a red color resist unit is formed by a third patterning process. In an embodiment, a red color resist layer is deposited on the base substrate, then is exposed and developed by using a photolithographic mask to form the red color resist unit. The widths of the overlapping regions formed between color resist units have been described in detail above and will not be repeatedly described herein. The photolithographic mask for forming the red color resist unit may be formed using a method similar to the method for forming the photolithographic mask for forming the blue color resist unit as described above, which is not repeatedly described herein.

According to an embodiment of the present disclosure, after fabricating the color resist units and the alignment mark, the method may further include: forming a planarization layer on a side of the color resist units away from the base substrate, and forming a spacer by a fourth patterning process on a side of the planarization layer away from the color resist units. According to an embodiment of the present disclosure, the fourth patterning process may also be a photolithography process. The materials for forming the planarization layer and the spacer have been described in detail above and will not be described again.

It should be noted that, in the present disclosure, the photoresist used may be a positive photoresist or a negative photoresist.

A solution of the present disclosure will be described below by way of specific embodiments. It is to be understood that the following embodiments are merely for the purpose of explaining the disclosure and are not intended to limit the scope of the disclosure. In the case where specific techniques or conditions are not indicated in the embodiments, the solution is carried out according to the techniques or conditions described in the literature in the art or in accordance with the product specifications.

Figure 7:
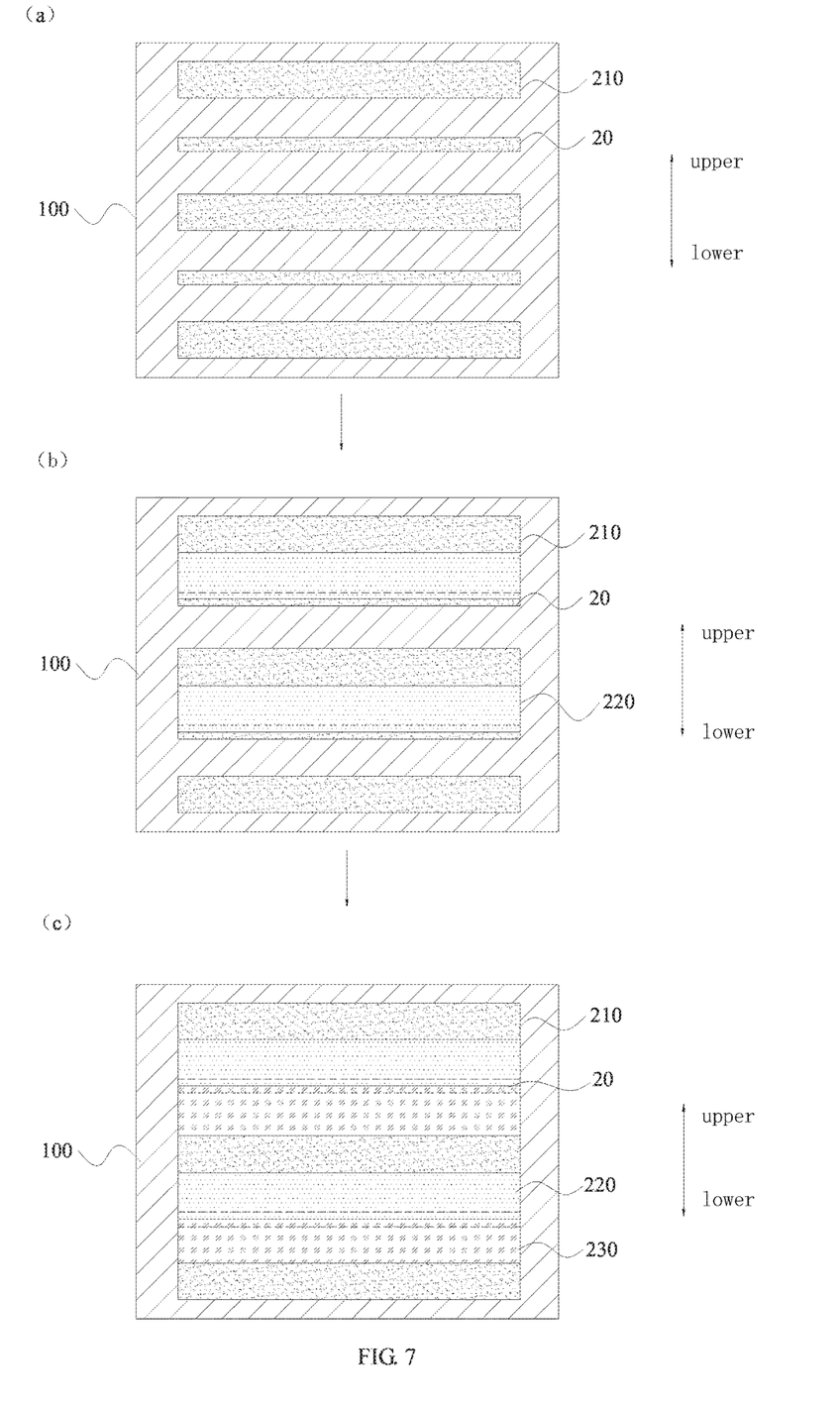
FIG. 7 is a schematic flow chart of a method for fabricating a color filter substrate according to an embodiment of the present disclosure.

First, a blue color resist layer is deposited on the base substrate, and then a photoresist is deposited on the side of the blue color resist layer away from the base substrate, and then the photoresist is exposed and developed to form a photolithographic mask for forming a blue color resist unit and an alignment mark, the mask having a pattern of the blue color resist unit and a pattern of the alignment mark. Then, the blue color resist layer is exposed and developed using the photolithographic mask to obtain the blue color resist unit 210 and the alignment mark 20 as shown in (a) of FIG. 7. Since exposure levels in the thickness direction of the blue color resist layer are different in the exposure process, the formed blue color resist unit 210 has inclined sidewalk, and a longitudinal section (a cross section perpendicular to a direction in which the plurality of color resist units are arranged; for example, a cross section taken along line A-A in FIG. 1) of the blue color resist unit 210 is a non-inverted trapezoid. The width of the alignment mark 20 can be roughly determined according to the width L of the overlapping region of the blue color resist unit 210 and the green color resist unit to be fabricated in the subsequent step, and the exposure deviation CD of the material of the blue color resist, for example, the actual width of the alignment mark 20 may be equal to (L+2±CD) microns. In this case, since the formed blue color resist unit and the alignment mark are used for subsequent alignment, the exposure process is required to have a high exposure precision, and therefore it is recommended to use an exposure machine with a high exposure precision, for example, Nikon FX-66S.

Then, a green color resist layer is deposited on the base substrate, and a photoresist is deposited on the side of the green color resist layer away from the base substrate to form a photolithographic mask for forming a green color resist unit. Subsequently, the green color resist layer is exposed and developed using the photolithographic mask to obtain a green color resist unit 220 as shown in (b) of FIG. 1. In the process of forming the green color resist unit 220, the upper edge of the green color resist unit 220 is defined by the lower edge of the blue color resist unit 210 (i.e., the lower edge of the blue color resist unit 210 is taken as the starting boundary of the green color resist unit 220), and the lower edge of the green color resist unit 220 is determined by the alignment mark 20. Specifically, the lower edge of the green color resist unit 220 takes the lower edge of the alignment mark 20 as its maximum boundary, and the longitudinal section of the formed green color resist unit is a parallelogram-like structure. In this case, the exposure precision required by the exposure process is lower than that required in the exposure process for forming the patterns of the blue color resist unit and the alignment mark, and an exposure machine having a low exposure precision such as NSK RZ-1500EXC or the like may be used.

Then, a red color resist layer is deposited on the base substrate, and a photoresist is deposited on the side of the red color resist layer away from the base substrate to form a photolithographic mask for forming a red color resist unit. The red color resist layer is exposed and developed using the photolithographic mask to obtain a red color resist unit 230 as shown in (c) of FIG. 7. In the process of forming the red color resist unit 230, the lower edge of the red color resist unit 230 may take the upper edge of another blue color resist unit 210 as the starting boundary, and the upper edge of the red color resist unit 230 is determined by the alignment mark 20. Specifically, the upper edge of the red color resist unit 230 takes the upper edge of the alignment mark 20 as its maximum boundary, and the longitudinal section of the formed red color resist unit is an inverted trapezoidal structure. In this case, the exposure precision required by the exposure process is substantially the same as that required by the exposure process for forming the green color resist unit, and lower than that required by the exposure process for forming the patterns of the blue color resist unit and the alignment mark. An exposure machine having a low exposure precision such as NSK RZ-1500EXC or the like may also be used.

Subsequently, a planarization layer and a spacer are fabricated on a side of the color resist units away from the base substrate. Specifically, a layer of OC is deposited on a side of the color resist units away from the base substrate to form a planarization layer. Subsequently, a spacer layer is deposited on the side of the planarization layer away from the color resist units, and the spacer is formed by exposure and developing processes.

The foregoing descriptions are given by taking RGB stripe as an example, each color resist unit is formed as a strip, and in this case, the filter layer includes a plurality of color resist units arranged in a plurality of rows, and an edge of an orthographic projection of one of the plurality of color resist units on the base substrate extends into an area of an orthographic projection of the color resist unit adjacent thereto on the base substrate. However, it will be understood that the present disclosure is also applicable to other color schemes and RGB arrangements. For example, when the second color resist units include three colors, the step of sequentially forming the second color resist units will require an additional patterning process to form a second color resist unit of a third color. For another example, when an arrangement other than stripe arrangement is employed, the mask used in the patterning process has a different pattern. However, it can be understood that, in the process of forming the second color resist units of the plurality of colors, the second color resist unit of a single color adjacent to the first color resist unit may be formed first, and then the second color resist unit of another single color adjacent to the first color resist unit or the formed second color resist unit is formed based on the edge of the first color resist unit and/or the formed second color resist unit, and so on, until all the second color resist units are formed.

In the description of the present disclosure, the orientations or positional relationships indicated by the terms "upper", "lower" and the like are based on the orientation or positional relationship shown in the drawings, merely for facilitating description of the present disclosure rather than requiring that the disclosure must be constructed and operated in specific orientations, and are therefore not to be construed as limiting the disclosure.

In the description of the present specification, the description referring to the terms "one embodiment", "another embodiment" or the like means that the specific features, structures, materials or characteristics described in connection with the embodiments are included in at least one embodiment of the present disclosure. In the present specification, the schematic representation of the above terms is not necessarily directed to the same embodiment or example. Furthermore, the particular features, structures, materials, or characteristics described may be combined in a suitable manner in any one or more embodiments or examples. Further, various embodiments or examples described in the specification, as well as features of various embodiments or examples, may be combined by those skilled in the art without contradiction. In addition, it should be noted that in the present specification, the terms "first" and "second" are used for descriptive purposes only, and are not to be construed as indicating or implying a relative importance or implicitly indicating the number of technical features.

The embodiments of the present disclosure have been shown and described above, but it is understood that the above-described embodiments are illustrative and are not to be construed as limiting the scope of the disclosure. Those skilled in the art can make changes, modifications, substitutions and variations to the embodiments within the scope of the present disclosure.

What is claimed is:

1. A color filter substrate, comprising:
   a base substrate; and
   a filter layer on the base substrate and comprising a plurality of color resist units of a plurality of colors,
   wherein orthographic projections of adjacent color resist units of different colors on the base substrate have an overlapping region; and
   wherein the plurality of color resist units of the plurality of colors comprise a first color resist unit having a first color and a plurality of second color resist units having a plurality of colors, light transmittance of the first color resist unit is lower than light transmittances of the second color resist units, and an alignment mark is provided between two adjacent second color resist units having different colors.

2. The color filter substrate of claim 1, wherein for two adjacent color resist units of different colors, at least a part of a sidewall of each color resist unit close to the other color resist unit is an inclined surface, and orthographic projections of the respective inclined surfaces on the base substrate completely coincide.

3. The color filter substrate of claim 1, wherein an orthographic projection of the alignment mark on the base substrate covers the overlapping region of the orthographic projections of the two adjacent second color resist units having different colors on the base substrate.

4. The color filter substrate of claim 1, wherein the alignment mark and the first color resist unit are in a same layer and made of a same material, and a height of the alignment mark is smaller than a height of the first color resist unit.

5. The color filter substrate of claim 1, wherein a width K of the alignment mark satisfies: K=L+2 µm, where L is a width of the overlapping region.

6. The color filter substrate of claim 1, wherein the plurality of color resist units comprise first color resist units and second color resist units arranged in a plurality of rows, and the second color resist units comprise color resist units of two colors.

7. The color filter substrate of claim 6, wherein in a direction perpendicular to a direction in which the plurality of color resist units are arranged, a cross section of the first color resist unit is a non-inverted trapezoid, and a cross section of the second color resist unit having a first color is an inverted trapezoid, and a cross section of the second color resist unit having a second color is a parallelogram.

8. The color filter substrate of claim 1, wherein the first color resist unit is a blue color resist unit, and the second color resist units comprise a red color resist unit and a green color resist unit.

9. A display device, comprising a color filter substrate, the color filter substrate comprising:
   a base substrate; and
   a filter layer on the base substrate and comprising a plurality of color resist units of a plurality of colors,
   wherein orthographic projections of adjacent color resist units of different colors on the base substrate have an overlapping region; and
   wherein the plurality of color resist units of the plurality of colors comprise a first color resist unit having a first color and a plurality of second color resist units having a plurality of colors, light transmittance of the first color resist unit is lower than light transmittances of the second color resist units, and an alignment mark is provided between two adjacent second color resist units having different colors.

10. The display device of claim 9, further comprising:
    an array substrate assembled with the color filter substrate and provided with a plurality of gate lines and a plurality of data lines,
    wherein an orthographic projection, on the array substrate, of at least one of the gate line and the data line is within an orthographic projection, on the array substrate, of the alignment mark on the color filter substrate.

11. The display device of claim 9, wherein the display device is a virtual reality display device.

12. A method for fabricating a color filter substrate, wherein the color filter substrate comprises: a base substrate; and a filter layer on the base substrate and comprising a plurality of color resist units of a plurality of colors, wherein orthographic projections of adjacent color resist units of different colors on the base substrate have an overlapping region, and the method comprises:
    sequentially forming the plurality of color resist units of the plurality of colors on the base substrate,
    wherein a boundary of the color resist unit previously formed determines a starting boundary of the color resist unit that is to be formed subsequently and adjacent to the color resist unit previously formed;
    wherein the plurality of color resist units comprise a first color resist unit having a first color and a plurality of second color resist units having a plurality of colors, light transmittance of the first color resist unit is lower than light transmittances of the second color resist units, and sequentially forming the plurality of color resist units of the plurality of colors on the base substrate comprises:

forming, on the base substrate, the first color resist unit by a first patterning process; and sequentially forming the second color resist units having the plurality of colors by patterning processes based on an edge of the first color resist unit wherein color resist units having a same color among the second color resist units are simultaneously formed through a same patterning process; and the method further comprises: forming an alignment mark, wherein the alignment mark is disposed between adjacent second color resist units of different colors that are subsequently formed, and in a step of sequentially forming the second color resist units, an edge, away from the first color resist unit, of the second color resist unit having a first color which is first formed is determined by the alignment mark.

13. The method of claim 12, wherein the plurality of color resist units comprise first color resist units and second color resist units arranged in a plurality of rows, and the second color resist units comprises color resist units of two colors;

forming, on the base substrate, the first color resist unit by the first patterning process comprises:

forming, on the base substrate, the first color resist units arranged in parallel by the first patterning process, sequentially forming the second color resist units having the plurality of colors by patterning processes based on the edge of the first color resist unit comprises:

forming, based on edges of the first color resist units, a plurality of second color resist units having a first color and arranged in parallel by a second patterning process; and forming, based on edges of the second color resist units having the first color away from the respective first color resist units, a plurality of second color resist units having a second color and arranged in parallel by a third patterning process.

14. The method of claim 13, wherein an exposure precision of an exposure process in the first patterning process for forming the first color resist unit is higher than an exposure precision of an exposure process in the patterning processes for forming the second color resist units.

15. The method of claim 12, wherein an orthographic projection of the alignment mark on the base substrate covers an overlapping region of orthographic projections of two adjacent second color resist units having different colors on the base substrate.

16. The method of claim 12, wherein the alignment mark and the first color resist unit are synchronously formed by the first patterning process.

17. The method of claim 12, wherein a width K of the alignment mark satisfies: $K=L+2$ μm, where L is a width of an overlapping region of adjacent second color resist units having different colors and on opposite sides of the alignment mark.

* * * * *